United States Patent
Hatanaka et al.

(10) Patent No.: US 8,928,363 B2
(45) Date of Patent: Jan. 6, 2015

(54) SEMICONDUCTOR DRIVE CIRCUIT AND POWER CONVERSION APPARATUS USING SAME

(75) Inventors: Ayumu Hatanaka, Tokyo (JP); Kaoru Kato, Tokyo (JP); Katsumi Ishikawa, Tokyo (JP); Naoki Maru, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/238,770

(22) PCT Filed: Sep. 30, 2011

(86) PCT No.: PCT/JP2011/072529
§ 371 (c)(1),
(2), (4) Date: Feb. 13, 2014

(87) PCT Pub. No.: WO2013/046420
PCT Pub. Date: Apr. 4, 2013

(65) Prior Publication Data
US 2014/0191784 A1    Jul. 10, 2014

(51) Int. Cl.
*H03K 3/00* (2006.01)
*H03K 3/012* (2006.01)
*H01L 27/06* (2006.01)
*H02M 1/08* (2006.01)
*H02M 1/38* (2007.01)

(52) U.S. Cl.
CPC .......... *H03K 3/012* (2013.01); *H01L 27/0629* (2013.01); *H02M 1/08* (2013.01); *H02M 1/38* (2013.01); *Y02B 70/1483* (2013.01)
USPC .......... 327/109; 327/110; 327/374; 327/419; 363/21.1; 363/55

(58) Field of Classification Search
USPC ................ 327/109–110, 112, 374, 376–377, 327/380–381, 387, 419, 427, 432, 437; 363/16, 20, 21.1, 55, 56.1
See application file for complete search history.

(56) References Cited

U.S. PATENT DOCUMENTS

| 5,349,270 | A  | * | 9/1994 | Roll et al. ................. 315/209 R |
| 8,102,677 | B2 | * | 1/2012 | Nakanishi ................. 363/21.02 |
| 2008/0205100 | A1 | | 8/2008 | Sakamoto |
| 2010/0014320 | A1 | | 1/2010 | Nakanishi |
| 2010/0301784 | A1 | | 12/2010 | Tagome et al. |
| 2011/0080192 | A1 | | 4/2011 | Ogawa et al. |

FOREIGN PATENT DOCUMENTS

| CN | 102017386 A | 4/2011 |
| JP | 6-22560 A | 1/1994 |
| JP | 2002-335679 A | 11/2002 |

(Continued)

OTHER PUBLICATIONS

Corresponding International Search Report with English Translation dated Dec. 27, 2011 (four (4) pages).

*Primary Examiner* — An Luu
(74) *Attorney, Agent, or Firm* — Crowell & Moring LLP

(57) ABSTRACT

The dead time is secured stably in a semiconductor drive circuit for switching devices using a wide band gap semiconductor. The drain terminal of the switching device of an upper arm is connected to the positive terminal of a first power supply, the source terminal of the switching device of a lower arm is connected to the negative terminal of the first power supply, and the source terminal of the switching device of the upper arm is connected with the drain terminal of the switching device of the lower arm. A gate drive circuit provided for each switching device includes an FET circuit and a parallel circuit made of a parallel connection of a first resistor and a first capacitor and having a first terminal connected to the gate terminal of the switching device.

8 Claims, 4 Drawing Sheets

(56) References Cited

FOREIGN PATENT DOCUMENTS

| | | |
|---|---|---|
| JP | 2005-65404 A | 3/2005 |
| JP | 2007-288919 A | 11/2007 |
| JP | 2008-211703 A | 9/2008 |
| JP | 2010-28962 A | 2/2010 |
| JP | 4512671 B1 | 7/2010 |
| JP | 2011-77462 A | 4/2011 |
| WO | WO 2010/070899 A1 | 6/2010 |

* cited by examiner

SEMICONDUCTOR DRIVE CIRCUIT AND POWER CONVERSION APPARATUS USING SAME

TECHNICAL FIELD

The present invention relates to a semiconductor drive circuit for switching devices using a wide band gap semiconductor, and to a power conversion apparatus employing the semiconductor drive circuit.

BACKGROUND ART

When a semiconductor drive circuit is used to drive a power conversion apparatus such as an inverter, the switching devices of the upper and lower arms are driven by using a pulse transformer that is configured to generate voltages of opposite polarities between the gate and source of the switching device of the upper arm and between the gate and source of the switching device of the lower arm. Specifically, rectangular-wave voltages +Vts [V]→0[V]→−Vts [V]→0 [V] are repeatedly applied between the terminals of the upper arm pulse transformer secondary winding and rectangular-wave voltages −Vts [V]→0[V]→+Vts [V]→0 [V] are repeatedly applied between the terminals of the lower arm pulse transformer secondary winding with the same timing.

The period during which the switching devices are in the OFF state in the period in which the voltage between the terminals of the upper arm pulse transformer secondary winding and the voltage between the ends of the lower arm pulse transformer secondary winding are both 0 [V] is called a "dead time". The dead time is a period that is essential for preventing the short circuit between the upper and lower arms. Assuming that the length of the period in which the rectangular-wave voltage is at +Vts [V] or −Vts [V] is 50, for example, the length of the period of 0 [V] has to be set at approximately 1 to 2.

Patent Literature 1 is known as a circuitry technology for stably securing the dead time in cases where MOSFETs using Si semiconductors are driven. In this technology, the electric current path for charging the input capacitance (Ciss) at the time of turning ON and the electric current path for the discharge from the input capacitance at the time of turning OFF are separated from each other by use of a diode or the like. Further, elements such as resistors are arranged in the circuit so that the impedance of the charging current path becomes lower than that of the discharging current path. With such a configuration, the turn-on time is relaxed (increased) and the turn-off time is decreased (turn-off speed is increased) so as to stably secure the dead time.

Meanwhile, switching devices (junction FETs, metal-oxide-semiconductor FETs (MOSFETs), bipolar junction transistors (BJTs), high-electron-mobility transistors (HEMTs), etc.) using a wide band gap semiconductor such as silicon carbide (SiC), gallium nitride (GaN) or diamond are being brought into practical use in recent years.

Since such switching devices are formed by using a wide band gap semiconductor of high breakdown voltage, the semiconductor layer thickness in the voltage application direction can be reduced and excellent properties such as low conduction resistance can be achieved.

On the other hand, the reduction in the semiconductor layer thickness shortens the distances between the source/drain/gate electrodes and is causing an increase in parasitic capacitance inside the device (gate-drain capacitance (Cgd), gate-source capacitance (Cgs), drain-source capacitance (Cds)).

As a result, the switching time for the turning ON/OFF increases due to the increase in the input capacitance (Ciss=Cgd+Cgs).

Circuitry described in Patent Literature 2 is capable of reducing the turn-off time (increasing the turn-off speed) by setting the gate-source voltage of the junction FET at the time of turning OFF at a negative voltage by use of a capacitor 15a.

However, trouble occurs when the voltage between the terminals of the pulse transformer changes from −Vts [V] to 0 [V] in a state in which electric potential making the gate's side of the capacitor 15a be the positive side is remaining at the terminals of the capacitor 15a due to a factor like a too short OFF period. In this state, due to the application of the voltage via the capacitor 15a, positive voltage is applied between the gate and the source of the junction FET, causing the turn ON action of the junction FET and making it difficult to stably secure the dead time.

A configuration capable of adjusting the turn-on time and the turn-off time by separating the gate current path at the time of turning ON from the gate current path at the time of turning OFF is illustrated in FIG. 7 of the Patent Literature 2. However, due to the addition of a diode 16a, no potential difference occurs between the terminals of the capacitor 15a shown in FIG. 7 in cases where the ON period is long. Therefore, since the gate-source voltage of the switching element cannot be set negative at the time of turning OFF and the reduction of the turn-off time (increase of the turn-off speed) is impossible, it has been difficult to stably secure the dead time.

CITATION LIST

Patent Literature

Patent Literature 1: JP-2002-335679-A
Patent Literature 2: JP-2011-77462-A

SUMMARY OF INVENTION

Technical Problem

As described above, the conventional techniques involve the problem that it is difficult to stably secure the dead time in cases where a semiconductor drive circuit is employed for driving a power conversion apparatus formed of switching devices using a wide band gap semiconductor.

The object of the present invention, which has been made to resolve the above problem, is to provide a semiconductor drive circuit capable of stably securing the dead time by achieving both an operation of rapidly turning OFF a switching device using a wide band gap semiconductor and an operation of slowly turning ON such a switching device. Another object of the present invention is to provide a power conversion apparatus employing such a semiconductor drive circuit.

Solution to Problem

To resolve the above problem, the present invention provides a semiconductor drive circuit comprising: an arm formed of an upper arm and a lower arm including a series connection of switching devices using a wide band gap semiconductor; and gate drive circuits for respectively driving the switching devices. In the arm, the drain terminal of the switching device of the upper arm is connected to the positive terminal of a first power supply, the source terminal of the switching device of the lower arm is connected to the negative terminal of the first power supply, and the source terminal of the switching device of the upper arm is connected with the drain terminal of the switching device of the lower arm. The gate drive circuit provided for each switching device includes an FET circuit and a parallel circuit made of a parallel connection of a first resistor and a first capacitor and having a first terminal connected to the gate terminal of the switching device. The source terminal of the FET circuit is connected to a second terminal of the parallel circuit, the gate terminal of the FET circuit is connected to one end of a second capacitor, a second resistor is connected between the drain and gate terminals of the FET circuit, and a second power supply is connected between the drain terminal of the FET circuit and the other terminal of the second capacitor. The second power supply is a three-level power supply outputting three levels of zero potential, a positive value and a negative value and is an alternating power supply having periods in which its output takes on the zero potential between the positive value and the negative value. The second power supply is configured so that the negative value is applied to one of the gate drive circuits in periods in which the positive value is applied to the other of the gate drive circuits. The other terminal of the second capacitor connected to the gate terminal of the FET circuit is connected to the source terminal of the switching element.

Preferably, the switching device is a normally-OFF junction FET, a MOSFET or a bipolar transistor using a wide band gap semiconductor such as silicon carbide, gallium nitride or diamond. The switching element is provided with a first diode connected antiparallel thereto.

Preferably, a second diode and a third resistor are connected in series between the drain terminal of the FET circuit and the gate terminal of the switching device. The anode terminal of the second diode is connected to the drain terminal's side of the FET circuit. The cathode terminal of the second diode is connected to the gate terminal's side of the switching device to supply forward current to the gate terminal of the switching device.

Preferably, a third diode is connected between the drain terminal of the FET circuit and the gate terminal of the switching device. The cathode terminal of the third diode is connected to the drain terminal's side of the FET circuit. The anode terminal of the third diode is connected to the gate terminal's side of the switching element.

To resolve the above problem, the present invention provides a power conversion apparatus employing a semiconductor drive circuit, comprising: a plurality of arms each of which is formed of an upper arm and a lower arm including a series connection of switching devices using a wide band gap semiconductor; and gate drive circuits for respectively driving the switching devices of the arms. In each of the arms, the drain terminal of the switching device of the upper arm is connected to the positive terminal of a first power supply, the source terminal of the switching device of the lower arm is connected to the negative terminal of the first power supply, and the source terminal of the switching device of the upper arm is connected with the drain terminal of the switching device of the lower arm. A load is connected between the arms' connection points each of which connects the source terminal of the switching device of the upper arm with the drain terminal of the switching device of the lower arm. The gate drive circuit provided for each switching device includes an FET circuit and a parallel circuit made of a parallel connection of a first resistor and a first capacitor and having a first terminal connected to the gate terminal of the switching device. The source terminal of the FET circuit is connected to a second terminal of the parallel circuit, the gate terminal of the FET circuit is connected to one terminal of a second capacitor, a second resistor is connected between the drain and gate terminals of the FET circuit, and a second power supply is connected between the drain terminal of the FET circuit and the other terminal of the second capacitor. The second power supply is a three-level power supply outputting three levels of zero potential, a positive value and a negative value and is an alternating power supply having periods in which its output takes on the zero potential between the positive value and the negative value. The second power supply is configured so that the negative value is applied to one of two gate drive circuits for driving the switching devices of the upper and lower arms in periods in which the positive value is applied to the other of the two gate drive circuits. The other terminal of the second capacitor connected to the gate terminal of the FET circuit is connected to the source terminal of the switching device.

Advantageous Effects of Invention

According to the present invention, in a semiconductor drive circuit for driving switching devices of a wide band gap semiconductor, the dead time can be secured stably through the reduction of the turn-off time (increase of the turn-off speed) and the relaxation (increase) of the turn-on time.

According to an embodiment of the present invention, both the securement of the dead time and low conduction loss can be achieved in a semiconductor drive circuit for driving switching devices of a wide band gap semiconductor such as SiC-JFETs.

According to an embodiment of the present invention, both the securement of the dead time and the low conduction loss can be achieved in a power conversion apparatus employing switching devices using a wide band gap semiconductor, in a power supply circuit employing such a power conversion apparatus, and in a motor driving circuit employing such a power conversion apparatus.

According to an embodiment of the present invention, miniaturization and high efficiency of the apparatus can be achieved through the reduction of the conduction loss.

DESCRIPTION OF EMBODIMENTS

In the following, embodiments of a semiconductor drive circuit and a power conversion apparatus employing the semiconductor drive circuit in accordance with the present invention will be described in detail with reference to figures.

Example 1

Figure 1:
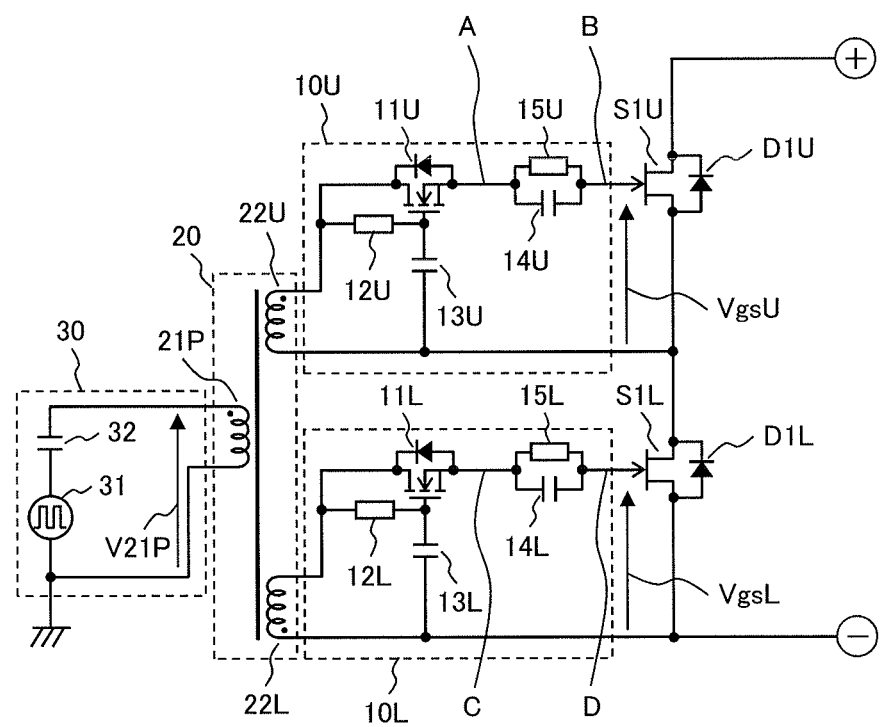
FIG. 1 is a circuitry diagram showing a semiconductor drive circuit in accordance with a first embodiment.

FIG. 1 is a circuitry diagram of a semiconductor drive circuit in accordance with a first embodiment of the present invention. FIG. 1 shows a part of the semiconductor drive circuit regarding switching devices for one phase (upper and lower arms connected in series).

<FIG. 1: Overall Configuration of Semiconductor Drive Circuit>

Among the switching devices for one phase (upper and lower arms connected in series) shown in FIG. 1, the upper arm is made up of a normally-OFF junction FET S1U using SiC (SiC-JFET) and a Schottky barrier diode D1U using SiC (SiC-SBD), for example. Similarly, the lower arm is made up of a normally-OFF junction FET S1L using SiC (SiC-JFET) and a Schottky barrier diode D1L using SiC (SiC-SBD).

In the following explanation, the junction FETs S1U and S1L and the Schottky barrier diodes D1U and D1L will be referred to as "switching devices" and "diodes", respectively. The combination of the switching devices and the diodes will be referred to as a "switching device circuit" as needed.

In addition to the switching device circuit for one phase (upper and lower arms connected in series), the semiconductor drive circuit comprises an upper arm gate drive circuit 10U, a lower arm gate drive circuit 10L, a pulse transformer 20 and a drive waveform generating circuit 30.

The upper arm gate drive circuit 10U includes an N-channel MOSFET 11U, a resistor 12U and a capacitor 13U for adjusting the turn-on time, and a capacitor 14U and a resistor 15U for increasing the turn-off speed. The lower arm gate drive circuit 10L is configured basically in the same way as the upper arm gate drive circuit 10U. The lower arm gate drive circuit 10L includes an N-channel MOSFET 11L, a resistor 12L and a capacitor 13L for adjusting the turn-on time, and a capacitor 14L and a resistor 15L for increasing the turn-off speed.

In the following explanation, the N-channel MOSFETs 11U and 11L will be referred to simply as "FETs".

The pulse transformer 20 includes a primary winding 21P, an upper arm secondary winding 22U and a lower arm secondary winding 22L. The turns ratio between the primary side (primary winding) and the secondary side (secondary winding) is 1:1 (in either the upper arm or the lower arm). As for the polarity, voltage in the same polarity as the primary side occurs in the upper arm secondary winding, while voltage in the opposite polarity to the primary side occurs in the lower arm secondary winding, as indicated by the filled circles drawn in the secondary windings 22U and 22L. In the following explanation, the side with the filled circle will be referred to as a "positive side" or a "second terminal" and the side without the filled circle will be referred to as a "negative side" or a "first terminal" as needed.

The drive waveform generating circuit 30 includes a gate power supply 31 and a capacitor 32 which is used for suppressing biased magnetization.

In the circuitry explained above, the character U/L at the end of the reference character of each circuit, device, etc. indicates that the circuit or device is a component of the upper/lower arm. This rule is employed also in the figures explained below.

<FIG. 1: Configuration of Switching Device Circuits of Upper and Lower Arms>

The switching device circuits of the upper and lower arms connected in series are configured as explained below. In the switching device circuit of the upper arm, the cathode terminal of the diode D1U is connected to the drain terminal of the switching device S1U. The anode terminal of the diode D1U is connected to the source terminal of the switching device S1U.

In the switching device circuit of the lower arm, the cathode terminal of the diode D1L is connected to the drain terminal of the switching device S1L. The anode terminal of the diode D1L is connected to the source terminal of the switching device S1L.

In the switching device circuit of the upper/lower arm, the diode D1 is generally attached as an external device. The upper/lower arm switching device circuit is formed by the diode D1 and the switching device S1. Each switching device is formed by using a wide band gap semiconductor.

The switching device circuit for one phase (upper and lower arms connected in series) is formed by connecting the source terminal of the upper arm switching device S1U and the drain terminal of the lower arm switching device S1L together. The drain terminal of the upper arm switching device S1U is connected to the positive terminal of a power supply that is unshown in FIG. 1. On the other hand, the source terminal of the lower arm switching device S1L is connected to the negative terminal of the power supply unshown in FIG. 1. The source terminal of the switching device S1U is connected to a load (e.g., inductor) that is unshown in FIG. 1.

<FIG. 1: Configuration of Gate Drive Circuit 10>

First, the configuration of the upper arm gate drive circuit 10U will be explained. The gate drive circuit 10U is formed of a parallel circuit of the capacitor 14U and the resistor 15U, the FET 11U, the capacitor 13U, and the resistor 12U.

A first terminal of the parallel circuit is connected to the gate terminal of the upper arm switching device S1U. A second terminal at the other terminal of the parallel circuit is connected to the source terminal of the FET 11U.

The FET 11U has a diode connected between its source and drain terminals. The drain terminal of the FET 11U is connected to a second terminal of the secondary winding 22U in the pulse transformer 20 (positive side of the secondary winding 22U: the terminal with the filled circle in the secondary winding 22U shown in FIG. 1). The gate terminal of the FET 11U is connected to a first terminal of the secondary winding 22U in the pulse transformer 20 (negative side of the secondary winding 22U: the terminal without the filled circle in the secondary winding 22U shown in FIG. 1) via the capacitor 13U. Further, the resistor 12U is connected between the gate and drain terminals of the FET 11U.

Next, the configuration of the lower arm gate drive circuit 10L will be explained. The lower arm gate drive circuit 10L is configured basically in the same way as the upper arm gate drive circuit 10U. Specifically, the gate drive circuit 10L is formed of a parallel circuit of the resistor 14L and the capacitor 15L, the FET 11L, the capacitor 13L, and the resistor 12L.

A first terminal of the parallel circuit is connected to the gate terminal of the lower arm switching device S1L. A second terminal at the other terminal of the parallel circuit is connected to the source terminal of the FET 11L.

The FET 11L has a diode connected between its source and drain terminals. The drain terminal of the FET 11L is connected to a first terminal of the secondary winding 22L in the pulse transformer 20 (negative side of the secondary winding 22L: the terminal without the filled circle in the secondary winding 22L shown in FIG. 1). The gate terminal of the FET 11L is connected to a second terminal of the secondary winding 22L in the pulse transformer 20 (positive side of the secondary winding 22L: the terminal with the filled circle in the secondary winding 22L shown in FIG. 1) via the capacitor 13L. Further, the resistor 12L is connected between the gate and drain terminals of the FET 11L.

<FIG. 1: Configuration of Pulse Transformer 20 and Drive Waveform Generating Circuit 30>

A series circuit of the drive waveform generating circuit 30 and the capacitor 32 is connected between the terminals of the primary winding 21P of the pulse transformer 20. One terminal of the drive waveform generating circuit 30 is grounded.

The drive waveform generating circuit 30 generates a three-level voltage waveform (voltage values changing like positive value→0→negative value→0→positive value). Consequently, when voltages changing like positive value→0→negative value→0→positive value are successively applied to the upper arm winding 22U by the pulse transformer 20 and the drive waveform generating circuit 30 shown in FIG. 1, voltages changing like negative value→0→positive value→0→negative value are successively applied to the lower arm winding 22L. Thus, in the states with nonzero voltages, the negative value (negative voltage) is applied to one of the windings 22U and 22L in periods in which the positive value (positive voltage) is applied to the other of the windings 22U and 22L.

The first terminal of the upper arm winding 22U (negative side of the secondary winding 22U: the terminal without the filled circle in the secondary winding 22U shown in FIG. 1) is connected to the source terminal of the upper arm switching device S1U. The second terminal of the lower arm winding 22L (positive side of the secondary winding 22L: the terminal with the filled circle in the secondary winding 22L shown in FIG. 1) is connected to the source terminal of the lower arm switching element S1L.

In the following, the operation in the first embodiment will be described with reference to a timing chart of FIG. 2.

Figure 2:
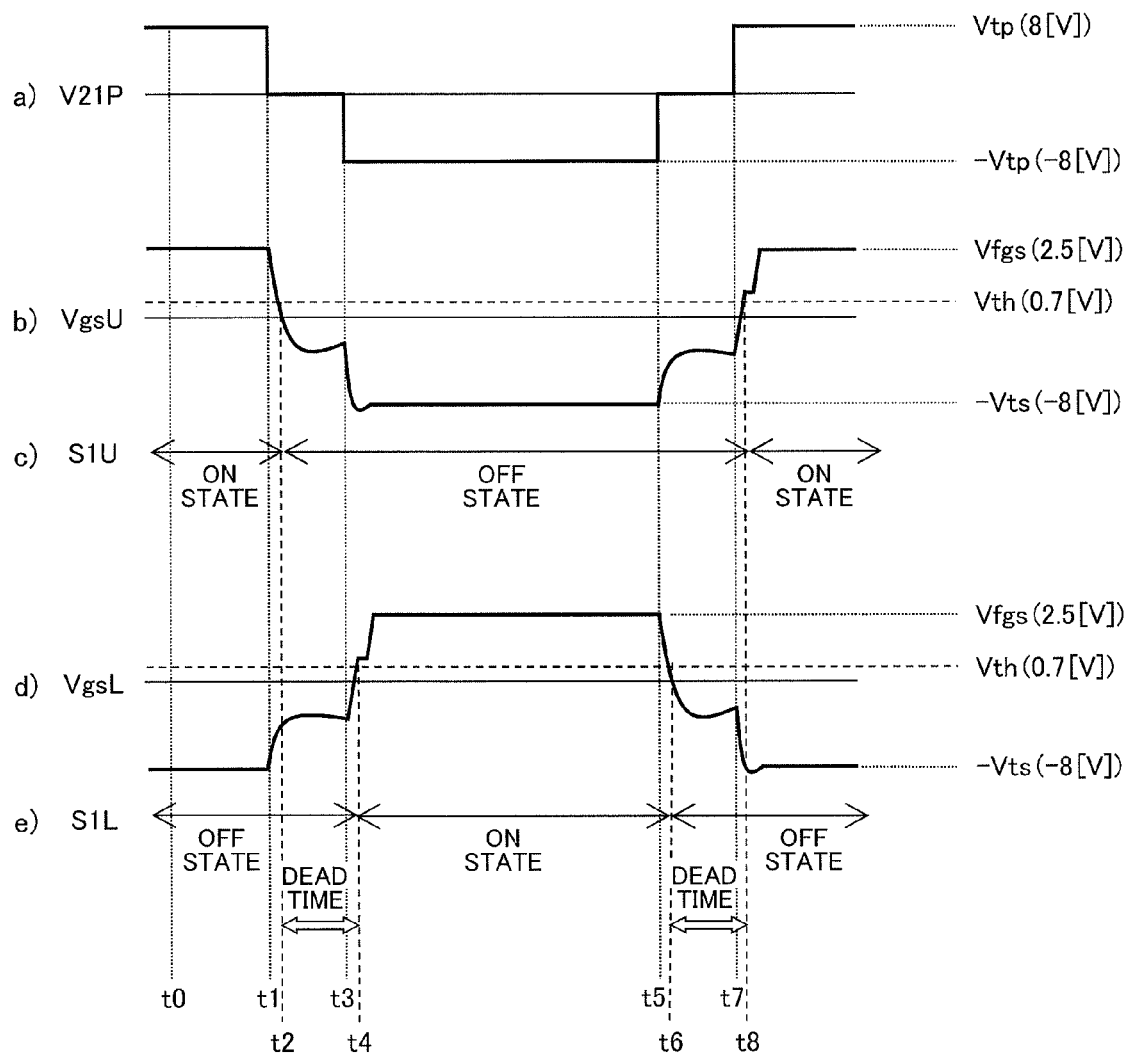
FIG. 2 is a timing chart showing current/voltage waveforms in the first embodiment.

<FIG. 2: Timing Chart of Signal at Each Part of Semiconductor Drive Circuit>

FIG. 2 illustrates, from top to bottom, a) primary winding voltage V21P, b) gate-source voltage VgsU of the switching device S1U, c) ON/OFF status of the switching device S1U, d) gate-source voltage VgsL of the switching device S1L, and e) ON/OFF status of the switching device S1L.

In the following explanation, the operation at each level of the primary winding voltage V21P in one voltage change cycle (positive value→0→negative value→0→positive value) will be explained in turn. This explanation will be given assuming that the positive value and the negative value in this example are 8 [V] and −8 [V], respectively.

<FIG. 2: When Primary Winding Voltage V21P is Positive (t0-t1)>

First, at the time t0 in FIG. 2 which is set as the initial state, the pulse transformer primary winding voltage V21P is at a prescribed voltage Vtp (8 [V]) and the voltage 8 [V] (=V21P) is being applied to the pulse transformer secondary winding 22U.

At this time, the N-channel MOSFET 11U (whose gate threshold voltage is 1.25 [V], for example) is operating in the ON state, with voltages 8 [V] and 6.75 [V] respectively applied to its gate and source terminals.

In this state, the gate-source voltage VgsU of the switching device S1U is clamped at the forward voltage Vfgs (2.5 [V]) of the gate-source diode (diode between the gate and source).

Thus, in this period (t0-t1), the FET 11U and the switching device S1U are both in the ON state. The electric potential at the first terminal of the parallel circuit of the capacitor 14U and the resistor 15U (point B potential) remains stable at 2.5 [V] and the electric potential at the second terminal of the parallel circuit (point A potential) remains stable at 6.75 [V].

Consequently, a voltage of +4.25 [V] (with reference to the terminal connected to the gate of the switching device S1U) is applied between the terminals of the parallel circuit (capacitor 14U). This phenomenon can be interpreted as the occurrence of a potential difference between the terminals of the capacitor 14U due to electric current flowing through the gate-source diode of the switching device S1U.

On the other hand, a voltage of −8 [V] (−V21P=−Vts) is applied to the pulse transformer secondary winding 22L in this period.

In this state, the gate-source voltage VgsL of the switching device S1L is approximately −8 [V] and the switching device S1L is in the OFF state. Electric current is conducted by the body diode of the FET 11L and the gate voltage of the switching device S1L remains at approximately −8 [V].

Thus, in this period (t0-t1), the FET 11L and the switching device S1L are both in the OFF state and the electric current is conducted by the body diode of the FET 11L. At this time, the electric potential at the first terminal of the parallel circuit of the capacitor 14L and the resistor 15L (point D potential) is −8 [V].

In the parallel circuit, the electric charge of the capacitor 14L has already been discharged by the resistor 15L at this time, and thus the electric potential at the second terminal of the parallel circuit (point C potential) is −8 [V] and the voltage difference between the terminals of the parallel circuit is approximately 0.

<FIG. 2: When Primary Winding Voltage V21P is 0 (t1-t3)>

At the time t1, the pulse transformer primary winding voltage V21P changes from Vtp (8 [V]) to 0 [V]. Accordingly, in the upper arm, the terminal voltage of the pulse transformer secondary winding 22U changes from 8 [V] to 0 [V] (=V21P).

Although the voltages at the gate and source terminals of the FET 11U drop sharply to 0 [V] at this time, the electric charges at both ends of the capacitor 14U are conserved during the change. Thus, immediately after the change of the primary winding voltage V21P from the positive value to 0, the point A potential drops to 0 [V], and the point B potential drops to −4.25 [V] due to the electric potential conserved by the capacitor 14U. Consequently, the gate-source voltage VgsU of the switching S1U is pulled down to −4.25 [V].

As above, the gate-source voltage VgsU starts dropping toward −4.25 [V] at the time point t1. At this time, the switching device S1U is still in the ON state. The switching device S1U turns OFF at the time t2 when the gate-source voltage VgsU falls below a prescribed threshold voltage (Vth=0.7 [V]). Incidentally, the gate-source voltage VgsU continues dropping even after the time t2. Thereafter, the gate-source voltage VgsU changes according to a discharging property which is determined by the capacitor 14U and the resistor 15U of the parallel circuit.

Since the gate-source voltage can be sharply pulled down to the negative potential as above when the switching device S1U turns OFF, the increasing of the turn-off speed becomes possible. For enabling the increase of the turn-off speed, it is desirable to increase the discharge time constant which is determined by the capacitor 14U and the resistor 15U of the parallel circuit.

On the other hand, in the pulse transformer secondary winding 22L, the voltage changes from −8 [V] to 0 [V] in this period.

Although electric current flows also to the gate terminal of the FET 11L at this time, the increase in the gate potential of the FET 11L is gradual and the FET 11L remains in the OFF state since its time constant (determined by the resistor 12U and the capacitor 13U connected to the gate terminal of the FET 11L) has been adjusted to be longer than the intended dead time.

In this state, the gate-source voltage VgsL increases via the output capacitance of the FET 11L. However, the gate-source voltage VgsL does not even reach 0 [V] and the OFF state of the switching device S1U can be kept stably since the output capacitance of the FET 11L is smaller than the input capacitance of the switching device S1U.

The overall operation of the circuit of FIG. 1 in the above period (t1-t3) is as follows: First, at the time point t1, the gate-source voltage VgsL starts changing toward a voltage value between −8 [V] and 0 [V]. At this point, the switching device S1L is in the OFF state. Even after this point, the gate-source voltage VgsL of the switching element S1L remains below 0 [V] and the switching device S1L remains in the OFF state.

In contrast, the gate-source voltage VgsU of the switching device S1U reaches the gate threshold voltage Vth (0.7 [V]) at the time t2. Accordingly, the switching element S1U is switched from the ON state to the OFF state. After the time t2, the gate-source voltage VgsU changes toward −4.25 [V] and the switching device S1U remains in the OFF state.

In short, the two switching devices S1U and S1L are both in the OFF state at the time point t2 and the so-called dead time starts at this point.

<FIG. 2: When Primary Winding Voltage V21P is 0 (t3-t5)>

At the time t3, the pulse transformer primary winding voltage V21P changes from 0 [V] to −Vtp (−8 [V]). At this point, the voltage of the pulse transformer secondary winding 22U changes from 0 [V] to −8 [V] (=V21P).

In the upper arm drive circuit 10U, the gate-source voltage VgsU of the switching device S1U, which has been approximately −4.25 [V], starts changing toward −8 [V]. Thereafter, the gate-source voltage VgsU of the switching device S1U remains below 0 [V] and the switching device S1U remains in the OFF state. While the FET 11U can either be in the ON state or in the OFF state, that does not matter since electric current is conducted via the channel of the FET 11U supposing the FET 11U is in the ON state and via the body diode supposing the FET 11U is in the OFF state.

On the other hand, in the lower arm drive circuit 10L, the voltage of the pulse transformer secondary winding 22L changes from 0 [V] to 8 [V]. At this point, the gate-source voltage VgsL of the switching device S1L, which had been negative until just before the point, starts changing toward 8 [V]. Since the gate-source voltage of the FET 11L rises and the FET 11L shifts to the ON state at this point, it becomes possible to supply electric current to the gate terminal of the switching element S1L via the channel of the FET 11L.

Consequently, the gate-source voltage VgsL of the switching device S1L reaches the gate threshold voltage Vth (0.7 [V]) at the time t4 and the switching element S1L is switched from the OFF state to the ON state.

To sum up, the dead time is secured as above till the time t4. As explained above, it becomes possible to stably secure the dead time in the period from the time t2 to the time t4. After the time t4, the gate-source voltage VgsL rises toward 8 [V] but is clamped at Vfgs (2.5 [V]) by the gate-source diode of the switching element S1L.

<FIG. 2: When Primary Winding Voltage V21P is 0 or Positive (t5-t8)>

Detailed explanation of the operation of the circuit of FIG. 1 in the subsequent period t5-t8 is omitted here since the operations of the upper arm circuit and the lower arm circuit in the period t5-t8 are equivalent to those of the lower arm circuit and the upper arm circuit in the above explanation. In this period, the dead time can be stably secured in the same way in the period from the time t6 to the time t8.

As described above, according to this embodiment, the resistor 12U, the capacitor 13U, the resistor 12L and the capacitor 13L are connected to the gates of the FETs 11U and 11L, by which the turn-on time can be relaxed (increased) while the turn-off time is decreased (the turn-off speed is increased) even when SiC-JFETs are used as the switching devices. Consequently, it becomes possible to stably secure the dead time.

For the implementation of the circuitry in accordance with the present invention, it is desirable to take the following points into consideration: First, in regard to the resistor 12 and the capacitor 13 connected to the gate of the FET 11, the time constant determined by the resistor 12 and the capacitor 13 is desired to set large (long) to be greater than or equivalent to the intended dead time. The threshold voltage which determines the turning ON of the FET 11 is desired to be as low as possible. The capacitance of the capacitor 14 constituting the parallel circuit is desired to be higher than the input capacitance of the switching device S1.

Incidentally, while SiC-JFETs have been described as an example of the switching devices S10 and S1L in this embodiment, equivalent effects can be achieved even when the switching devices SRI and S1L are implemented by normally-OFF junction FETs, MOSFETs or bipolar transistors using a wide band gap semiconductor such as silicon carbide, gallium nitride or diamond.

While the power supply which is made up of the pulse transformer 20 and the drive waveform generating circuit 30 in FIG. 1 can also be configured in some modified forms, the circuitry of the power supply ought to be designed basically as follows: The power supply is a three-level rectangular wave power supply that outputs three levels (zero potential, positive value and negative value) and an alternating power supply that has periods in which its output takes on the zero potential between the positive value and the negative value. The power supply is configured so that the negative value (negative voltage) is applied to one of the gate drive circuits in the periods in which the positive value (positive voltage) is applied to the other of the gate drive circuits. Further, the other terminal of the capacitor connected to the gate terminal of the FET circuit is connected to the source terminal of the switching device.

Example 2

Figure 3:
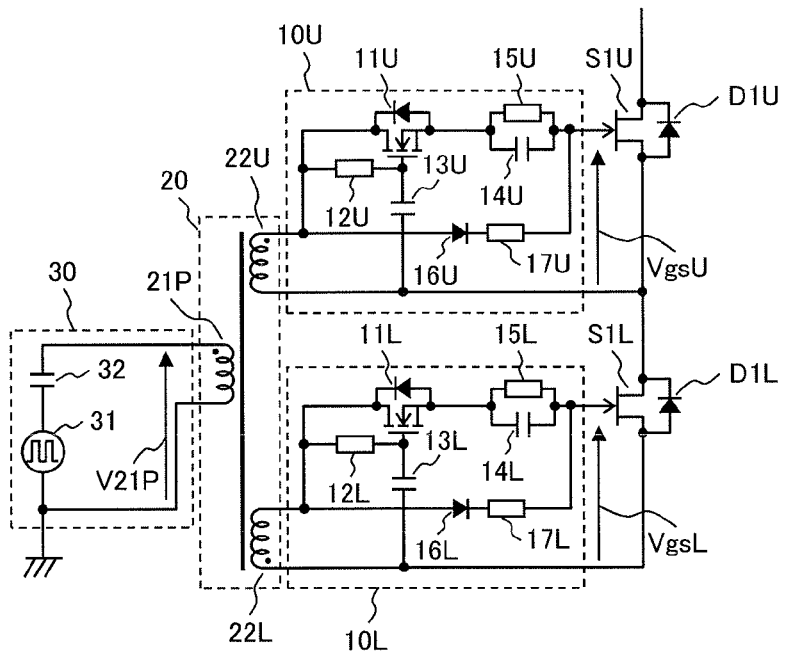
FIG. 3 is a circuitry diagram showing a semiconductor drive circuit in accordance with a second embodiment.

A second embodiment of the semiconductor drive circuit in accordance with the present invention will be described in detail below referring to FIG. 3. FIG. 3 is a circuitry diagram corresponding to FIG. 1 explained in the first embodiment. In this embodiment, components identical or equivalent to those in the first embodiment are assigned the already used reference characters and repeated explanation thereof is omitted for brevity. The following explanation will be given mainly of the difference from the first embodiment.

The gate drive circuit 10U shown in FIG. 3 differs from that of FIG. 1 in that a series circuit of a diode 16U and a resistor 17U is added between the drain terminal of the FET 11U and the gate terminal of the switching device S1U. Similarly, the gate drive circuit 10L shown in FIG. 3 differs from that of FIG. 1 in that a series circuit of a diode 16L and a resistor 17L is added between the drain terminal of the FET 11L and the gate terminal of the switching device S1L. The cathode terminal of the diode 16 is connected to the gate terminal's side of the switching device S1, while the anode terminal of the diode 16 is connected to the drain terminal's side of the FET 11.

The reason for employing such a configuration will be explained below.

First, in the normally-OFF junction FETs (semiconductor switches) S1U and S1L using silicon carbide (SiC), the gate-source voltage has to be set higher when a lower conduction resistance should be achieved. In other words, high electric current has to be conducted by the diode between the gate and the source.

Further, the resistors 15U and 15L have an optimum range of the resistance value for achieving high turn-off speed by adapting to the properties of the switching devices S1U and S1L. When a high resistance value becomes necessary, conduction of high electric current between the gate and the source of the switching device S1U/S1L becomes difficult.

The second embodiment of the present invention is capable of satisfying these conflicting conditions at the same time.

First, in this embodiment, sufficient electric current can be conducted (supplied) to the gate-source diode via the newly added series circuit of the diode 16 and the resistor 17 in the ON state of the switching device S1U/S1L shown in FIG. 3. Since low conduction resistance can be achieved, the conduction loss can be reduced.

Further, although the speed of increase of the gate-source voltage VgsU/VgsL becomes faster, the gate-source voltage VgsL in the period t1-t3 and the gate-source voltage VgsU in the period t5-t7 do not exceed 0 [V]. Therefore, each switching device S1U/S1L never turns ON in the above period.

As described above, according to the second embodiment, it becomes possible to provide a semiconductor drive circuit capable of achieving both the stable securement of the dead time and the low conduction loss irrespective of the properties of the switching devices.

Example 3

A third embodiment of the semiconductor drive circuit in accordance with the present invention will be described in detail below referring to FIG. 4.

Figure 4:
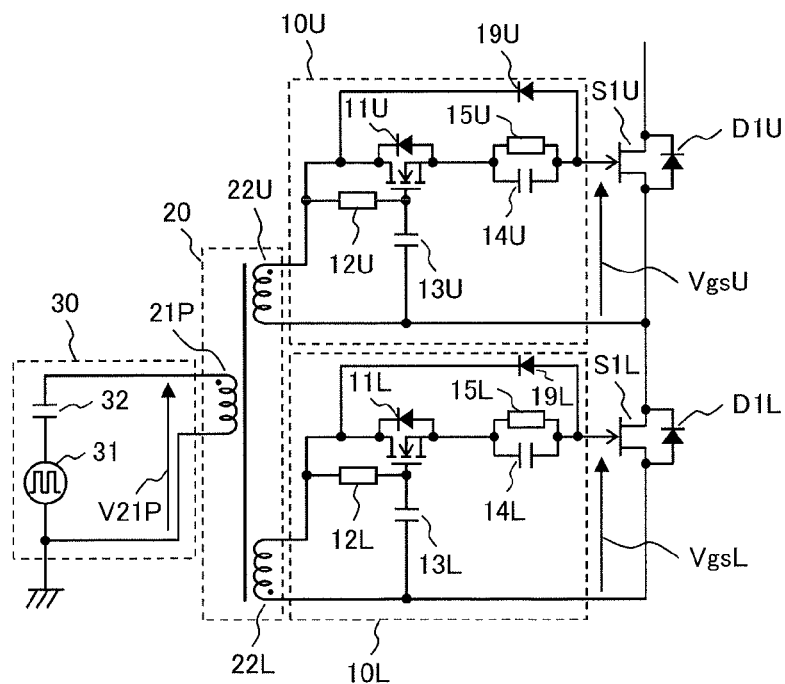
FIG. 4 is a circuitry diagram showing a semiconductor drive circuit in accordance with a third embodiment.

FIG. 4 is a circuitry diagram corresponding to FIG. 1 explained in the first embodiment. In this embodiment, components identical or equivalent to those in the first embodiment are assigned the already used reference characters and repeated explanation thereof is omitted for brevity. The following explanation will be given mainly of the difference from the first embodiment.

The gate drive circuit 10U shown in FIG. 4 differs from that of FIG. 1 in that a diode 19U is added between the drain terminal of the FET 11U and the gate terminal of the switching device S1U. Similarly, the gate drive circuit 10L shown in FIG. 4 differs from that of FIG. 1 in that a diode 19L is added between the drain terminal of the FET 11L and the gate terminal of the switching device S1L. The cathode terminal of the diode 19 is connected to the drain terminal's side of the FET 11, while the anode terminal of the diode 19 is connected to the gate terminal's side of the switching device S1.

According to this embodiment, the magnitude relationship between the drain terminal voltage of the FET 11U and the gate terminal voltage of the switching device S1U is determined by the forward drop (0.7 [V]) of the diode 19. This makes it possible to prevent the gate-source voltage VgsU from exceeding the voltage between the terminals of the pulse transformer secondary winding 22U due to electric current flowing in via the capacitance between the drain and the gate. Consequently, the dead time can be secured more stably irrespective of the properties of the switching devices.

Example 4

In the fourth embodiment, a power conversion apparatus employing the semiconductor drive circuit in accordance with the present invention will be described in detail referring to FIG. 5. In the power conversion apparatus (employing the semiconductor drive circuit) shown in FIG. 5, a configuration employing the semiconductor drive circuit of FIG. 3 is illustrated as the semiconductor drive circuit. Also in this embodiment, components identical or equivalent to those in the above embodiments are assigned the already used reference characters.

Figure 5:
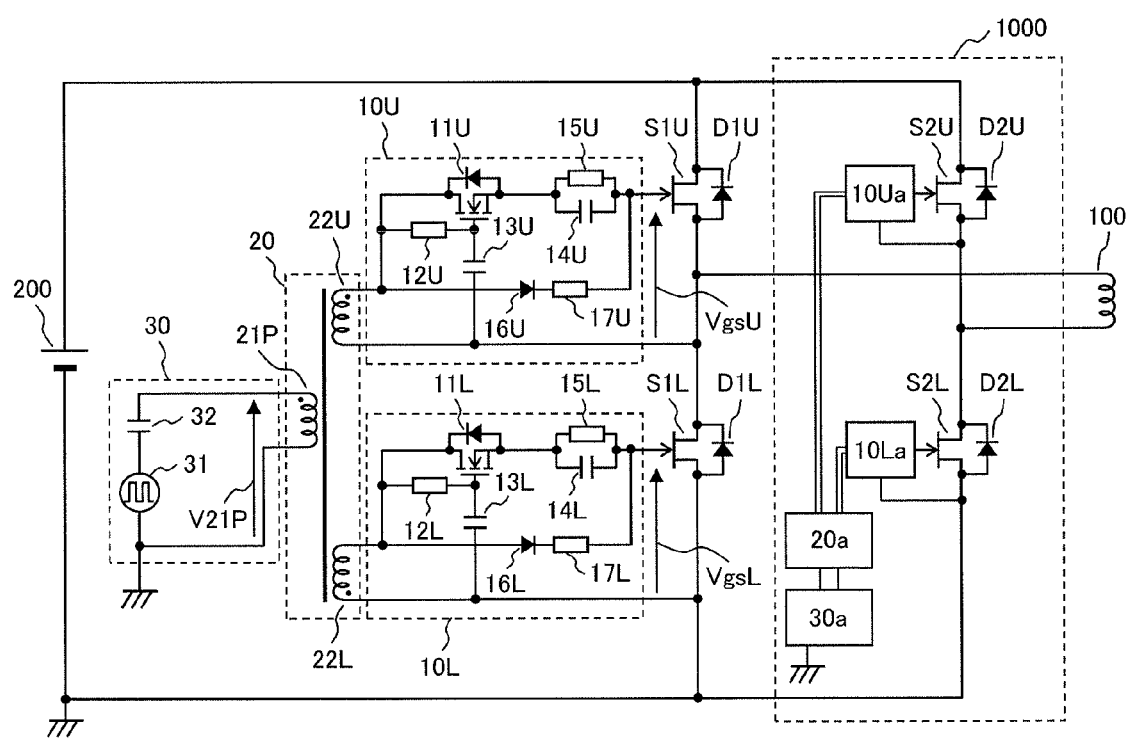
FIG. 5 is a circuitry diagram showing a power conversion apparatus in accordance with a fourth embodiment.

In FIG. 5, a DC voltage source 200, an other-phase circuit 1000, and an inductor 100 as a load have been added to the semiconductor drive circuit of FIG. 3. The other-phase circuit 1000 is configured identically with the semiconductor drive circuit of FIG. 3. Specifically, the upper and lower arm circuits are formed by connecting SiC-JFETs S2U and S2L (switching elements) in series and connecting each SiC-SBD D2U/D2L (diode) between the source and the drain of each switching element. The other-phase circuit 1000 further includes a gate drive circuit 10Ua (configured identically with the gate drive circuit 10U), a gate drive circuit 10La (configured identically with the gate drive circuit 10L), a pulse transformer 20a (configured identically with the pulse transformer 20) and a drive waveform generating circuit 30a (configured identically with the drive waveform generating circuit 30).

The drain terminal of the switching device S1U is connected to the positive terminal of the DC voltage source 200. The source terminal of the switching device S1L is connected to the negative terminal of the DC voltage source 200. The negative terminal of the DC voltage source 200 is connected to the ground (GND).

Also for the other-phase circuit 1000, the connection between terminals is made in the same way. Specifically, the drain terminal of the switching device S2U is connected to the positive terminal of the DC voltage source 200 and to the cathode terminal of the diode D2U. The source terminal of the switching device S2U is connected to the anode terminal of the diode D2U. The source terminal of the switching device S2L of the other-phase circuit 1000 is connected to the negative terminal of the DC voltage source 200 and the drain terminal of the switching device S2L is connected to the cathode terminal of the diode D2L. The source terminal of the switching device S2L is connected to the anode terminal of the diode D2L.

Further, the source terminal of the switching device S2U is connected to the drain terminal of the switching device S2L. The source terminal of the switching device S1U is connected to a first terminal of the inductor 100. The source terminal of the switching device S2U is connected to a second terminal of the inductor 100.

The gate drive circuit 10Ua is connected to the gate and source terminals of the switching device S2U and to the upper arm secondary winding of the pulse transformer 20a in the same way as the connection of the gate drive circuit 10U. The gate drive circuit 10La is connected to the gate and source terminals of the switching device S2L and to the lower arm secondary winding of the pulse transformer 20a in the same way as the connection of the gate drive circuit 10L. The pulse transformer 20a is connected to the gate drive circuit 10Ua, the gate drive circuit 10La and the drive waveform generating circuit 30a in the same way as the connection of the pulse transformer 20. The drive waveform generating circuit 30a is connected to the pulse transformer 20a and the ground (GND) in the same way as the connection of the drive waveform generating circuit 30.

By this embodiment, alternating current can be generated in the inductor 100 by alternately switching the switching devices S1U and S1L and the switching devices S2U and S2L.

According to the fourth embodiment, it becomes possible to provide a power conversion apparatus capable of achieving both the stable securement of the dead time and the low conduction loss irrespective of the properties of the switching elements.

The usage of the power conversion apparatus of this embodiment is not restricted to the separate use as a power conversion device; the power conversion device may be installed in power supply equipment such as a DC/DC converter. Further, the power conversion apparatus of this embodiment may also be implemented as a multiphased motor driving unit.

REFERENCE SIGNS LIST

S1U Upper arm switching device
S1L Lower arm switching device
D1U Upper arm diode
D1U Lower arm diode
10U Upper arm gate drive circuit
10L Lower arm gate drive circuit
11U, 11L N-channel MOSFET
12U, 12L, 15U, 15L, 17U, 17L Resistor
13U, 13L, 14U, 14L Capacitor
16U, 16L, 19U, 19L Diode
20 Pulse transformer
21P Pulse transformer primary winding
22U Upper arm pulse transformer secondary winding
22L Lower arm pulse transformer secondary winding
30 Drive waveform generating circuit
31 Gate power supply
32 Capacitor for suppressing biased magnetization
100 Inductor
200 DC voltage source
1000 Other-phase circuit
S2U Upper arm switching device of other-phase circuit
S2L Lower arm switching device of other-phase circuit
D2U Upper arm diode of other-phase circuit
D2L Lower arm diode of other-phase circuit
10Ua Upper arm gate drive circuit of other-phase circuit
10La Lower arm gate drive circuit of other-phase circuit
20a Pulse transformer of other-phase circuit
30a Drive waveform generating circuit of other-phase circuit

The invention claimed is:

1. A semiconductor drive circuit comprising:
an arm formed of an upper arm and a lower arm including a series connection of switching devices using a wide band gap semiconductor; and
gate drive circuits for respectively driving the switching devices, wherein:
in the arm, the drain terminal of the switching device of the upper arm is connected to the positive terminal of a first power supply, the source terminal of the switching device of the lower arm is connected to the negative terminal of the first power supply, and the source terminal of the switching device of the upper arm is connected with the drain terminal of the switching device of the lower arm;
the gate drive circuit provided for each switching device includes an FET circuit and a parallel circuit made of a parallel connection of a first resistor and a first capacitor and having a first terminal connected to the gate terminal of the switching device;
the source terminal of the FET circuit is connected to a second terminal of the parallel circuit, the gate terminal of the FET circuit is connected to one terminal of a second capacitor, a second resistor is connected between the drain and gate terminals of the FET circuit, and a second power supply is connected between the drain terminal of the FET circuit and the other terminal of the second capacitor;
the second power supply is a three-level power supply outputting three levels of zero potential, a positive value and a negative value and is an alternating power supply having periods in which its output takes on the zero potential between the positive value and the negative value;
the second power supply is configured so that the negative value is applied to one of the gate drive circuits in periods in which the positive value is applied to the other of the gate drive circuits; and
the other terminal of the second capacitor connected to the gate terminal of the FET circuit is connected to the source terminal of the switching device.

2. The semiconductor drive circuit according to claim 1, wherein:
the switching device is a normally-OFF junction FET, a MOSFET or a bipolar transistor using a wide band gap semiconductor such as silicon carbide, gallium nitride or diamond; and
the switching device is provided with a first diode connected antiparallel thereto.

3. The semiconductor drive circuit according to claim 1, wherein:
a second diode and a third resistor are connected in series between the drain terminal of the FET circuit and the gate terminal of the switching device;
the anode terminal of the second diode is connected to the drain terminal's side of the FET circuit; and
the cathode terminal of the second diode is connected to the gate terminal's side of the switching device to supply forward current to the gate terminal of the switching device.

4. The semiconductor drive circuit according to claim 1, wherein:
a third diode is connected between the drain terminal of the FET circuit and the gate terminal of the switching element;
the cathode terminal of the third diode is connected to the drain terminal's side of the FET circuit; and
the anode terminal of the third diode is connected to the gate terminal's side of the switching device.

5. A power conversion apparatus employing a semiconductor drive circuit, comprising:
a plurality of arms each of which is formed of an upper arm and a lower arm including a series connection of switching devices using a wide band gap semiconductor; and
gate drive circuits for respectively driving the switching devices of the arms, wherein:
in each of the arms, the drain terminal of the switching device of the upper arm is connected to the positive terminal of a first power supply, the source terminal of the switching device of the lower arm is connected to the negative terminal of the first power supply, and the source terminal of the switching device of the upper arm is connected with the drain terminal of the switching device of the lower arm;
a load is connected between the arms' connection points each of which connects the source terminal of the switching device of the upper arm with the drain terminal of the switching device of the lower arm;
the gate drive circuit provided for each switching device includes an FET circuit and a parallel circuit made of a parallel connection of a first resistor and a first capacitor and having a first terminal connected to the gate terminal of the switching device;

the source terminal of the FET circuit is connected to a second terminal of the parallel circuit, the gate terminal of the FET circuit is connected to one terminal of a second capacitor, a second resistor is connected between the drain and gate terminals of the FET circuit, and a second power supply is connected between the drain terminal of the FET circuit and the other terminal of the second capacitor;

the second power supply is a three-level power supply outputting three levels of zero potential, a positive value and a negative value and is an alternating power supply having periods in which its output takes on the zero potential between the positive value and the negative value;

the second power supply is configured so that the negative value is applied to one of two gate drive circuits for driving the switching devices of the upper and lower arms in periods in which the positive value is applied to the other of the two gate drive circuits; and the other terminal of the second capacitor connected to the gate terminal of the FET circuit is connected to the source terminal of the switching element.

6. The power conversion apparatus employing a semiconductor drive circuit according to claim 5, wherein:

the switching device is a normally-OFF junction FET, a MOSFET or a bipolar transistor using a wide band gap semiconductor such as silicon carbide, gallium nitride or diamond; and the switching device is provided with a first diode connected antiparallel thereto.

7. The power conversion apparatus employing a semiconductor drive circuit according to claim 5, wherein:

a second diode and a third resistor are connected in series between the drain terminal of the FET circuit and the gate terminal of the switching device;

the anode terminal of the second diode is connected to the drain terminal's side of the FET circuit; and the cathode terminal of the second diode is connected to the gate terminal's side of the switching device to supply forward current to the gate terminal of the switching device.

8. The power conversion apparatus employing a semiconductor drive circuit according to claim 5, wherein:

a third diode is connected between the drain terminal of the FET circuit and the gate terminal of the switching device;

the cathode terminal of the third diode is connected to the drain terminal's side of the FET circuit; and the anode terminal of the third diode is connected to the gate terminal's side of the switching device.

* * * * *